(12) United States Patent
Kim et al.

(10) Patent No.: US 6,947,348 B2
(45) Date of Patent: Sep. 20, 2005

(54) GAIN CELL MEMORY HAVING READ CYCLE INTERLOCK

(75) Inventors: Hoki Kim, Hopewell Junction, NY (US); Toshiaki Kirihata, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 17 days.

(21) Appl. No.: 10/604,374

(22) Filed: Jul. 15, 2003

(65) Prior Publication Data

US 2005/0024923 A1 Feb. 3, 2005

(51) Int. Cl.[7] ............................. G11C 8/00; G11C 7/00
(52) U.S. Cl. ...................................... 365/233; 365/203
(58) Field of Search ................................ 365/233, 203, 365/177, 222, 230.06

(56) References Cited

U.S. PATENT DOCUMENTS 5,054,002 A * 10/1991 Ninomiya et al. ........... 365/233
5,903,505 A * 5/1999 Wik et al. .................... 365/222
6,151,266 A * 11/2000 Henkels et al. ......... 365/230.06
6,385,122 B1 * 5/2002 Chang ......................... 365/233
6,577,530 B2 * 6/2003 Muranaka et al. ........... 365/177

* cited by examiner

*Primary Examiner*—Trong Phan
(74) *Attorney, Agent, or Firm*—Daryl K. Neff; H. Daniel Schnurmann

(57) ABSTRACT

A method is provided for accessing a storage cell of a dynamic random access memory (DRAM) having an array of gain cells being read accessible by a read wordline and a read bitline, and being write accessible by a write wordline and write bitline separate from said read wordline and read bitline. The method includes activating a read wordline of the array of gain cells to permit signals from a plurality of gain cells coupled to the read wordline to develop on a plurality of corresponding read bitlines coupled to the gain cells. An interlock signal is then generated in the DRAM after activating the read wordline. The read wordline is then deactivated in response to the interlock signal.

20 Claims, 7 Drawing Sheets

GAIN CELL MEMORY HAVING READ CYCLE INTERLOCK

BACKGROUND OF INVENTION

The present invention relates to integrated circuit memory, and more specifically to an apparatus and method of controlling a read cycle of a gain cell type dynamic random access memory with an interlock signal.

For several decades, the one transistor dynamic random access memory (DRAM) has been the dominant choice for high-density and low-cost semiconductor memory in computing systems. Recently, advancements in miniaturization have allowed DRAM to be integrated or "embedded" into the same integrated circuit ("IC" or "chip") as a processor which requires access to a memory. Embedding DRAM on the same chip with the processor not only reduces packaging cost, but also significantly increases available processor to memory bandwidth. Because of the smaller memory cell size, embedded DRAMs can be about three to six times denser than embedded static random access memories (SRAMs), and operate with lower power dissipation and up to 1000 times lower soft-error rate.

DRAMs which are embedded into chips having a processor function are typically implemented by a one transistor and one capacitor DRAM cell structure (1T1C cell), which is commonly used in standalone commodity DRAMs. FIG. 1a illustrates a transistor level schematic of a 1T1C DRAM cell 10A. When a wordline, e.g. WLA, of the DRAM is activated, the access transistor 11A coupled to that wordline turns on, which then couples the capacitor 12A having a voltage stored thereon to the bitline BLA. This results in a small voltage signal on BLA due to the transfer of charge from the capacitor 12A to BLA, or from BLA to the capacitor 12A depending on the value of the voltage stored on the capacitor. As a result of this charge transfer, the voltage on capacitor 12A that originally represented a data bit is destroyed, which is termed "destructive read".

Bitline BLA and another bitline BLB of the DRAM form a pair of bitlines coupled to a sense amplifier 15. The other bitline BLB of the pair, is not coupled to a memory cell 10A accessed by the activated wordline WLA, but is instead coupled to a memory cell 10B which is only accessible by a different wordline WLB. Bitline BLB retains a bitline precharge voltage, and is used to provide a reference voltage to a sense amplifier 15. At the sense amplifier 15, the small voltage difference between BLA and BLB of the bitline pair is amplified to rail-to-rail logic levels. The amplified logic level signals on the bitline pair BLA, BLB are then available to be read out from the memory. If the particular column address corresponding to bitline BLA has been selected through column select line CSL, the signals on the bitline pair are transferred to a pair of data lines DLA and DLB.

Whether or not the particular bitline pair is selected for read out by CSL, a writeback operation must now be performed to restore the data to all the cells of the 1T1C DRAM that have been accessed by the activated WLA, the data having been destroyed as a result of accessing those cells by WLA. This is performed by the sense amplifier 15 driving the pair of bitlines BLA, BLB with the amplified logic levels that were obtained in the previous step. As a result of this operation, the accessed cells are restored with the same data that they held before being accessed.

Instead of writing back the previously stored information, another possible operation at this time is to write new information into the accessed cell coupled to the bitline BLA. In this operation, the sense amplifier 15 drives the voltages on the pair of bitlines BLA and BLB to complementary low and high levels, or high and low levels, respectively, according to write data signals that are input thereto from the data line pair DLA and DLB. Typically, the write operation is performed after a read operation, because only some selected cells of the many cells that are accessed by the activated wordline WLA are to be written in a given write operation, and the data stored in other cells accessed by the activated wordline WLA are destroyed as a consequence of accessing the cells, i.e., the write operation to a 1T1C DRAM is destructive. The sense amplifier 15 must then write back the accessed data bits of the nonselected cells in a writeback operation as described above, which is typically done simultaneously with the write operation to the selected cells. This process of simultaneously writing back stored data while writing new data to some cells is known as a read modified write operation.

In a 1T1C DRAM, the destructive read operation followed by write back, and the read modified write operation made necessary because of the destructive nature of writing, require longer cycle times than read and write operations performed within an SRAM because read and write operations are nondestructive in an SRAM. This makes the performance advantage of conventional embedded DRAMs small over standalone commodity DRAMs. Hence, the essential advantage of conventional embedded DRAMs up to the present time has been to provide high-capacity memory on the same chip as a processor, e.g., for executing graphics applications, rather than as a high density, high performance alternative to SRAM.

In order to increase the benefits of using embedded DRAM over standalone DRAM or other types of IC memory, improvements have been made to the architecture of embedded DRAMs to improve bandwidth, latency and cycle time. Because the width of the input output (I/O) interface between processor and embedded memory is already much larger than the I/O width to an external (off-chip) memory, page mode operation which is commonly used for standalone DRAMs does not greatly increase the average speed of accessing the embedded DRAM. Instead, improvements in the time to randomly access cells of the DRAM (a measure of latency) and the cycle time (a measure of address bandwidth) are paramount to increasing the performance of the embedded DRAM relative to alternative types of on-chip memory, e.g. SRAM, or standalone DRAM. However, as described above, the performance of a 1T1C DRAM is strongly dependent on the cycle time needed to write back previously stored information after reading cells or while writing to selected cells of the DRAM.

A particular type of DRAM known as "gain cell DRAM" exhibits much improved cycle time over conventional 1T1C DRAM, due to the nondestructive nature by which the gain cell DRAM is read and written. Accordingly, in a gain cell DRAM, the long duration read/writeback operation and read modify write operation of 1T1C DRAM are not needed, such that the cycle time for accessing cells of the gain cell DRAM is much improved.

FIG. 1b shows a schematic of a three transistor, one capacitor cell 10 of a gain cell DRAM (3T1C gain cell DRAM). Each gain cell 10 includes a capacitor 21 for storing a voltage representing a data bit, a write access transistor 20C coupled to a write wordline WWL for storing a voltage on the capacitor 21 from a write bitline WBL, and a state transistor 20B having a gate coupled to the capacitor 21 for indicating the stored state on the capacitor 21 over many read operations performed after the voltage has been stored on the capacitor 21. The gain cell 10 also includes a read access transistor 20A coupled to a read wordline RWL for outputting the current high voltage or low voltage state of the state transistor 20B onto the read bitline RBL.

In operation, read access is provided by activating the read wordline RWL, which then couples the state transistor 20B to the read bitline RBL. Depending upon the voltage stored on the capacitor 21, which is the same voltage applied to the gate of state transistor 20B, the state transistor 20B will either be on or off. If the state transistor 20B is off, the read bitline RBL will exhibit a voltage at or near the supply voltage Vdd that is connected to RBL through resistor R10. That high voltage on RBL will be detected as a first stored data bit value, a "1", by the sense amplifier 25. However, if the state transistor 20B is on, the voltage on RBL will be pulled down by the conductive path to ground through transistors 20A and 20B. The sense amplifier 25 will detect the lowered voltage at that time on RBL as a different stored data bit, a "0", than for the higher RBL voltage, the "1", that exists when the state transistor 20B is turned off.

A write operation is performed using a write wordline WWL and write bitline WBL that are separate from the read wordline RWL and read bitline RBL that are provided for reading the gain cell 10. Writing is performed by activating the write wordline WWL to turn on transistor 20C, and then storing a write voltage on capacitor 21 from the write bitline WBL. The signal on the WBL is single ended. When writing to the gain cell 10, write control circuitry 27 drives the voltage on the write bitline WBL to either a high level such as the supply voltage VDD or a low level such as ground, depending on the value of the data bit being written.

It is apparent from the foregoing that read operations to the gain cell are nondestructive, in that the voltage stored on the capacitor 21 remains after many operations of reading the cell, since there is no conductive path between the capacitor 21 and the read bitline RBL. The nondestructive nature of the read operation allows the read cycle time to be shortened compared to 1T1C DRAMs, because accessed memory cells no longer need to be written back after reading. Because the read cycle time is so much shorter than in 1T1C DRAMs, use of a 3T1C gain cell design for DRAMs embedded into chips requiring fast access and low latency appears especially advantageous.

While the foregoing discussion indicates that gain cell DRAM may be an advantageous alternative to 1T1C DRAM, it would be desirable to further improve the cycle time and latency of gain cell DRAMs. In such way, gain cell DRAM can be an advantageous alternative to 1T1C DRAMs and/or SRAMs for embedding into chips having a processor function.

SUMMARY OF INVENTION

According to an aspect of the invention, fast read cycle embedded DRAM is provided using a three-transistor one capacitor (3T1C) gain cell structure.

According to another aspect of the invention, a method of controlling a read cycle of a gain cell DRAM is provided, by generating an interlock signal to minimize the time for performing a read operation, including minimizing read active time.

According to another aspect of the invention, a method is provided for accessing a storage cell of a dynamic random access memory (DRAM) having an array of gain cells being read accessible by a read wordline and a read bitline, and being write accessible by a write wordline and write bitline separate from the read wordline and read bitline. The method includes activating a read wordline of the array of gain cells to permit signals from a plurality of gain cells coupled to the read wordline to develop on a plurality of corresponding read bitlines coupled to the plurality of gain cells. An interlock signal is then generated in the DRAM after activating the read wordline. The read wordline is then deactivated in response to the interlock signal.

According to another aspect of the invention, a dynamic random access memory (DRAM) is provided which includes an array of gain cells being read accessible by a read wordline and a read bitline, and being write accessible by a write wordline and write bitline separate from the read wordline and read bitline. The DRAM further includes a row decoder operable in response to a row address strobe signal to activate a read wordline of the array of gain cells, to permit signals from a plurality of gain cells coupled to the read wordline to develop on a plurality of corresponding read bitlines coupled to the plurality of gain cells. The DRAM also includes a circuit operable to generate an interlock signal after the row address strobe signal, wherein the row decoder is further operable to deactivate the read wordline in response to the interlock signal.

According to another aspect of the invention, a method is provided for measuring read cycle performance of a gain cell DRAM.

BRIEF DESCRIPTION OF DRAWINGS

FIG. 2b is a schematic diagram illustrating an X-decoder of a RWL decoder portion of the gain cell DRAM illustrated in FIG. 2a.

FIG. 3b is a timing diagram illustrating operation according to the second embodiment of the invention illustrated in FIG. 3a.

FIG. 5b illustrates a timing diagram illustrating operation according to the third embodiment of the invention illustrated in FIG. 5a.

DETAILED DESCRIPTION

As described in the foregoing, 3T1C gain cell DRAM may be an attractive alternative to 1T1C DRAM that is typically being used in embedded DRAMs now. Faster read cycle time performance than 1T1C DRAM and smaller area requirement than SRAM make the 3T1C a viable option for implementing an embedded DRAM. The 3T1C gain cell DRAM makes possible an embedded DRAM that is competitive with SRAM in performance but which has higher integration density, typically being twice as compact as embedded SRAM, and therefore, presenting an especially attractive option.

As described in the embodiments herein, the read cycle performance of a 3T1C gain cell DRAM is further improved with the use of one or more interlock signals to indicate when signals on read bitlines are sufficiently developed to be amplified by sense amplifiers coupled to the gain cell array, or when the time has come for read bitlines of the gain cell to be precharged again for the next read cycle. Although reference has been made to use of the gain cell DRAM as an embedded element in chips having processors, there is no requirement that the invention be implemented as an embedded element, as performance improvements flow from the invention even if implemented in a standalone gain cell DRAM.

Figure 1A:
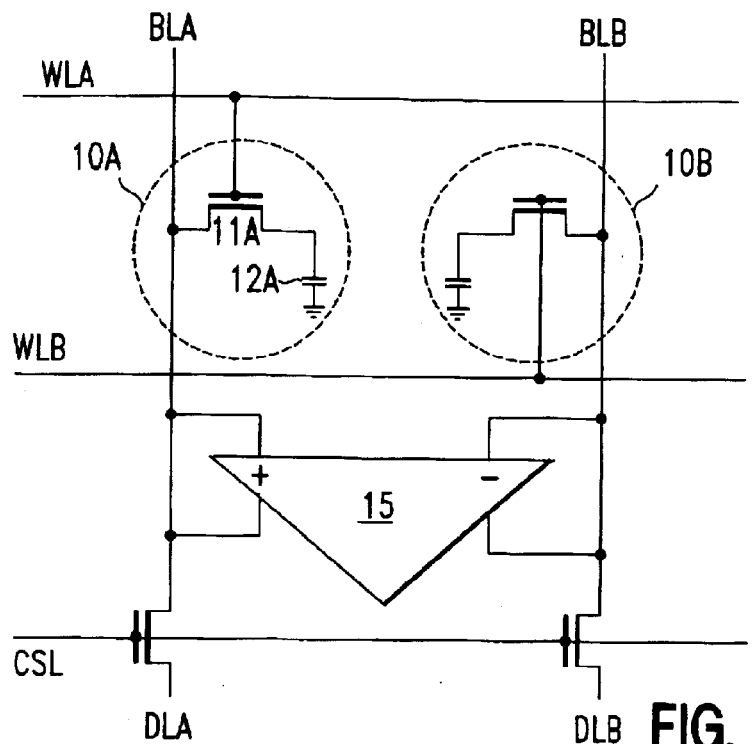
FIG. 1a illustrates the structure of a one transistor one capacitor DRAM.
Figure 1B:
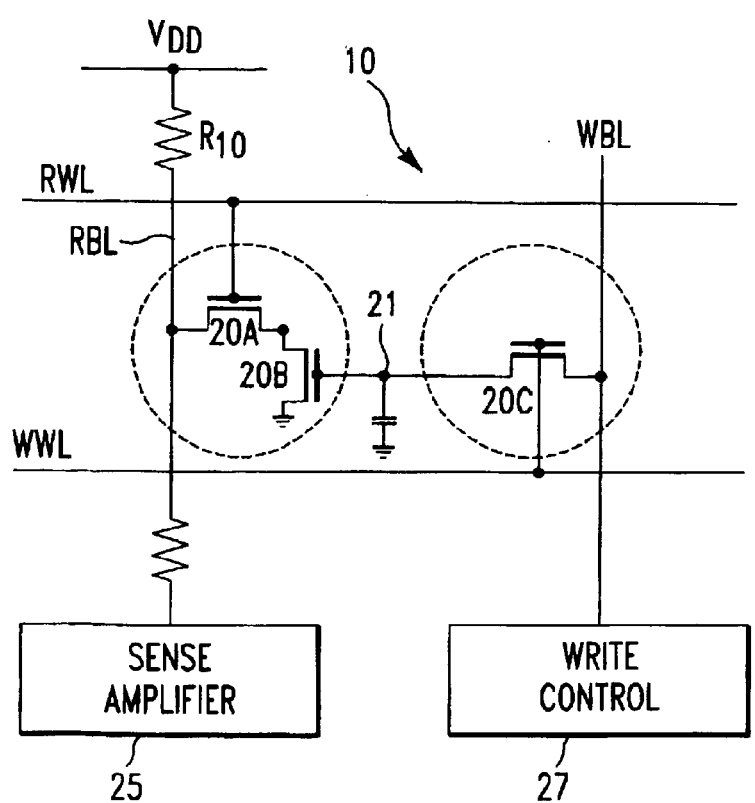
FIG. 1b illustrates the structure of a three transistor one capacitor gain cell DRAM.
Figure 2A:
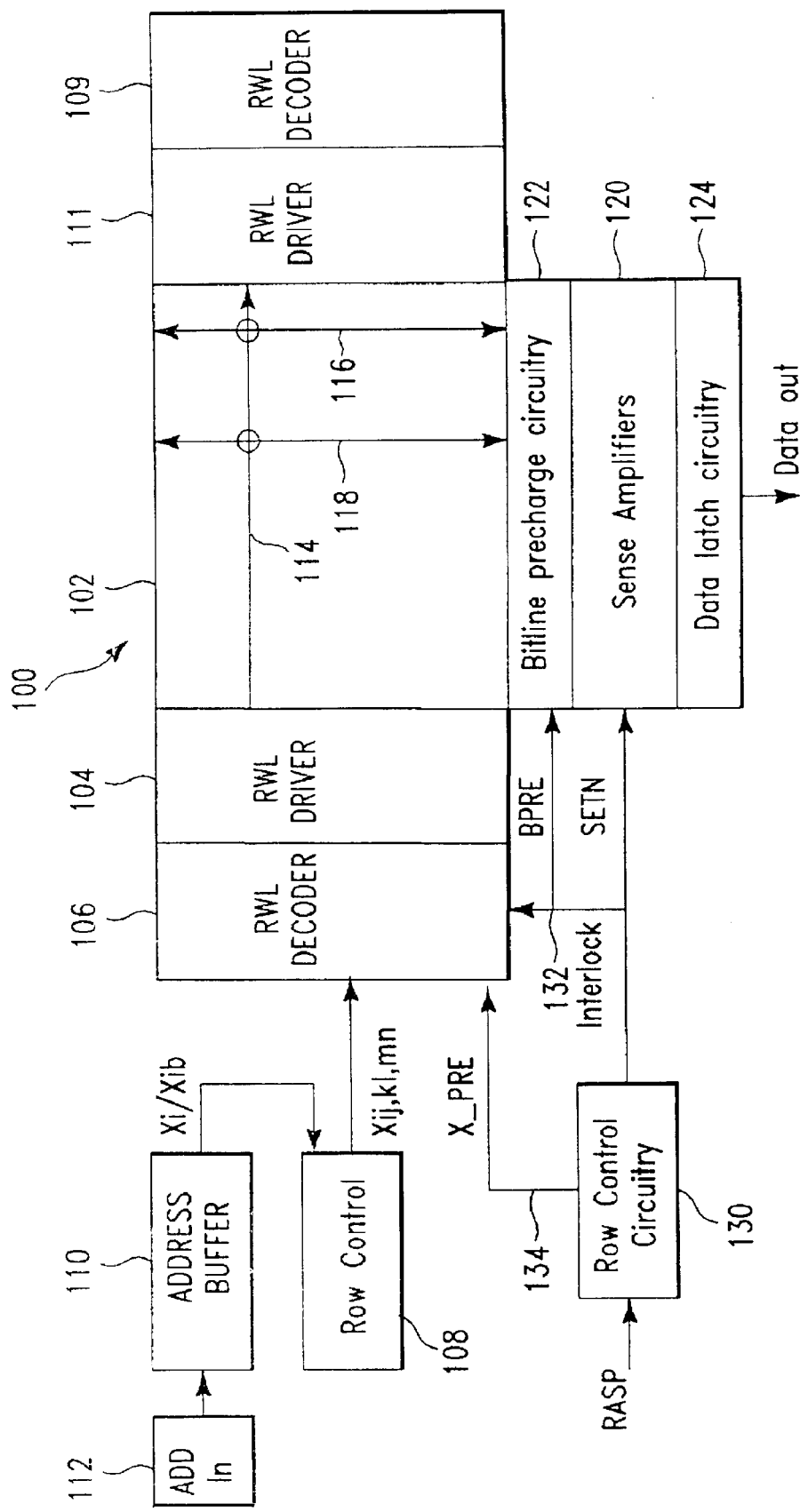
FIG. 2a is a block diagram illustrating an embodiment of the invention having a wordline interlock signal for controlling read cycle operation of a gain cell DRAM.

FIG. 2a is a block diagram illustrating a gain cell DRAM of a first embodiment of the invention. As shown in FIG. 2a, a gain cell DRAM 100 includes an array of gain cells 102 which are accessed by a plurality of read wordlines driven by a read wordline (RWL) driver 104, which, in turn, is driven by a read wordline (RWL) decoder 106. The RWL decoder 106 is also referred to as an "X-decoder", because it decodes row addresses which are generally designated as "X" addresses (as opposed to "Y" addresses which designate column addresses). The RWL decoder 106 receives predecoded row address input from a predecoder 108, which, in turn, partially decodes the row address from the address 112 input thereto through address buffer 110. A write wordline (WWL) decoder 109 and a write wordline (WWL) driver 111 are also shown connected to the gain cell array 102, although they will not be further discussed, as the focus of the invention is on improvements to read cycle operation.

When a row address is presented to the RWL decoder 106 and decoded and used to enable a RWL driver 104, a read wordline 114 within the gain cell array 102 is activated, which then permits the high and low states stored in gain cells accessed by the activated RWL to be transferred to read bitlines (RBLs), e.g. RBLs 116 and 118 of the gain cell array 102. The RBLs, in turn, are connected to sense amplifiers 120 through precharge circuitry 122. The sense amplifiers 120 are further connected to data latch circuitry 124, for buffering and outputting the data read from the array 102. During the active portion of the read cycle, sense amplifiers 120 latch the output of each RBL to a logic high bit or logic low bit and then output the latched bits through data latch circuitry 124.

Control over the timing of the read operation is effected through row control circuitry 130. In this first embodiment of the invention, the row control circuitry receives a row address strobe signal (RASP), the "P" indicating that the signal is suitable for input to a p-type field effect transistor (PFET). The RASP signal times the operation of row control circuitry 130 and its generation of other signals for controlling read operation of the array 102. For example, the signal X_PRE generated by the row control circuitry 130 times the precharging of X decoder circuits within the RWL decoder 106. Also generated in response to the RASP signal are a wordline interlock signal 132 which disables X decoder circuits. The interlock signals BPRE and SETN are further generated in response to the RASP signal, and are used for timing the precharging of read bitlines and the setting of sense amplifiers 120, respectively.

Figure 2B:
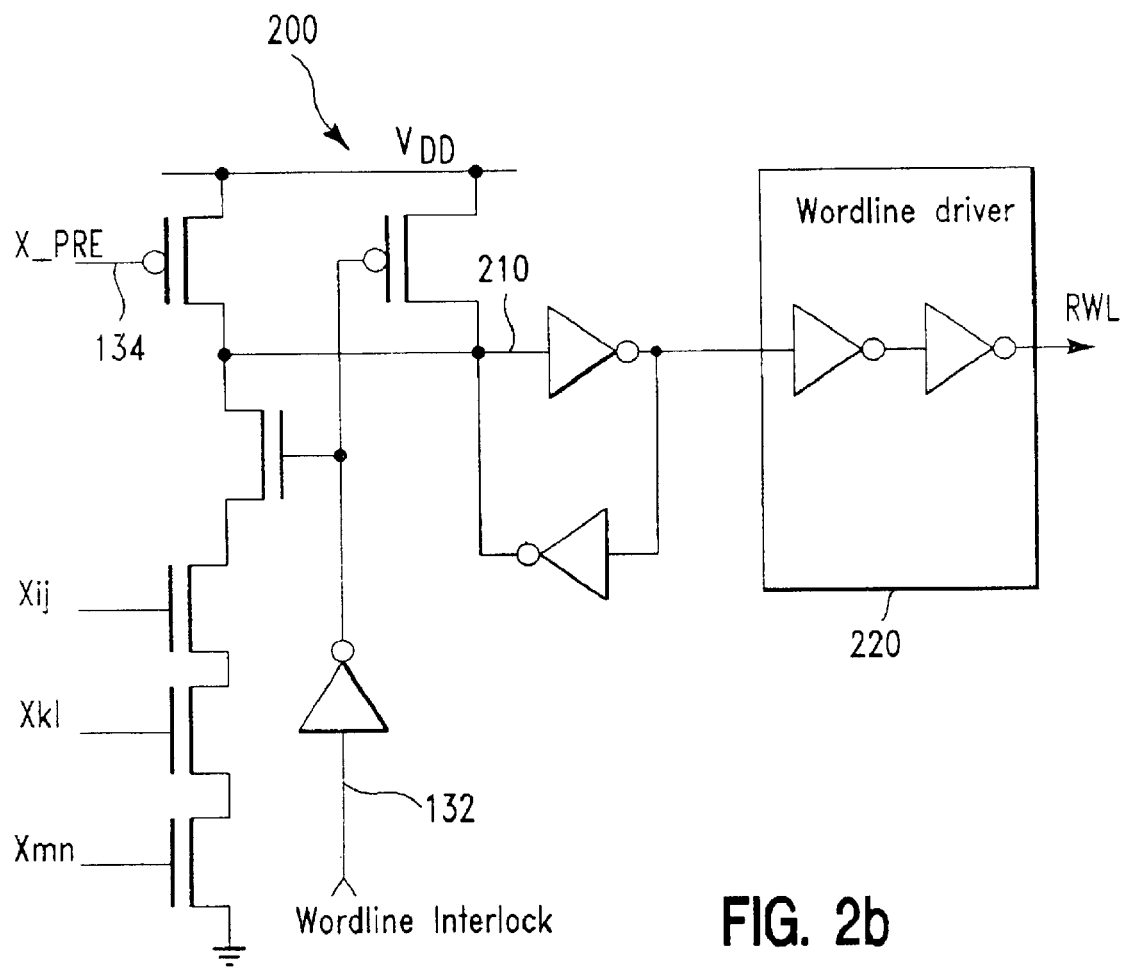

FIG. 2b is a schematic diagram illustrating the structure of an individual X-decoder circuit 200, as coupled to an inverter latch 210 and wordline driver 220, in turn, for selecting and driving a particular read wordline RWL. As shown in FIG. 2b, the X-decoder circuit 200 receives a set of predecoded row address inputs, for example: Xij, Xkl, and Xmn as shown. The X-decoder circuit 200 also receives precharge control input X_PRE 134 connected to the gate of a PFET coupled to a supply voltage VDD, and also receives a word line interlock signal 132 as input. As is apparent from the structure of the X-decoder, the read wordline RWL is activated only when all of the predecoded address inputs Xij, Xkl, Xmn are high, the precharge signal X_PRE, 134 is high and the wordline interlock signal 132 is high. Under any other condition, RWL is not activated. In a departure from general X-decoder circuitry, a wordline interlock signal 132 is provided directly to each X-decoder 200 of the RWL decoder, as a signal independent from the precharge control signal X_PRE 134, the wordline interlock signal 132 being capable of quickly deactivating the active RWL after sufficient time of the active portion of the read cycle has elapsed.

In an example of operation, the wordline interlock signal 132 controls the timing at which wordlines of the array are deactivated, such that the active read cycle time for each gain cell of the array is held to a minimum. In an exemplary read operation, the X-decoder 200 is initially precharged by a low-going input X_PRE 134, which holds RWL at an inactive level. Upon receipt of the RASP strobe, the row control circuitry 130 deactivates the X_PRE precharge signal 134 and also deactivates the wordline interlock signal 132, if active before. The predecoded address inputs Xij, etc., to X-decoder 200 now operate the X-decoder 200 to activate a particular read wordline RWL (e.g. RWL 114) when all of the address inputs thereto match. In such case, RWL 114 is activated, which then causes signals representing the data stored in each of the gain cells coupled to RWL 114 to be transferred onto read bitlines (RBL) including RBLs 116 and 118.

After a period of delay, determined in relation to the RASP strobe signal, the row control circuitry 130 generates the wordline interlock signal 132, which is then provided to X-decoders of the RWL decoder 106, and results in the deactivation of the RWL 114. Since the wordline interlock signal 132 is provided directly to each X-decoder 200, it disables the X-decoder regardless of the state of the precharge signal X_PRE 134, or the respective states of the address inputs Xij, Xkl, Xmn. The timing of the wordline interlock signal 132 is preferably controlled by the row control circuitry 130 in a manner which provides a timing margin relative to the SETN signal which times the start of signal amplification by the sense amplifiers 120. Thus, in a preferred embodiment, after a read word line 114 is activated, data from gain cells accessed thereby are sensed by the sense amplifiers 120 upon receiving the SETN signal. The sensed data is then latched by data latch circuitry 124 to hold the read data ready for data transfer. After these events, the row control circuitry 130 activates the wordline interlock signal 132, in response to which the RWL is deactivated. In this way, the read wordlines of the gain cell array are operated with a shortened "ON" time, or "active" time that is ended by the wordline interlock signal 132. Thereafter, the precharge cycle is promptly begun, to prepare for the next read operation.

The precharging of the read bitlines is conducted with the same timing as the wordline interlock signal 132, promptly after deactivating the wordline. Although the X-decoder 200 already begins the precharge cycle upon receipt of the wordline interlock signal 132, the X_PRE precharge signal 134 can also be activated now, for the purpose of holding the X-decoder 200 inactive until the time the X-decoder 200 is operated again in the next read cycle.

Figure 3A:
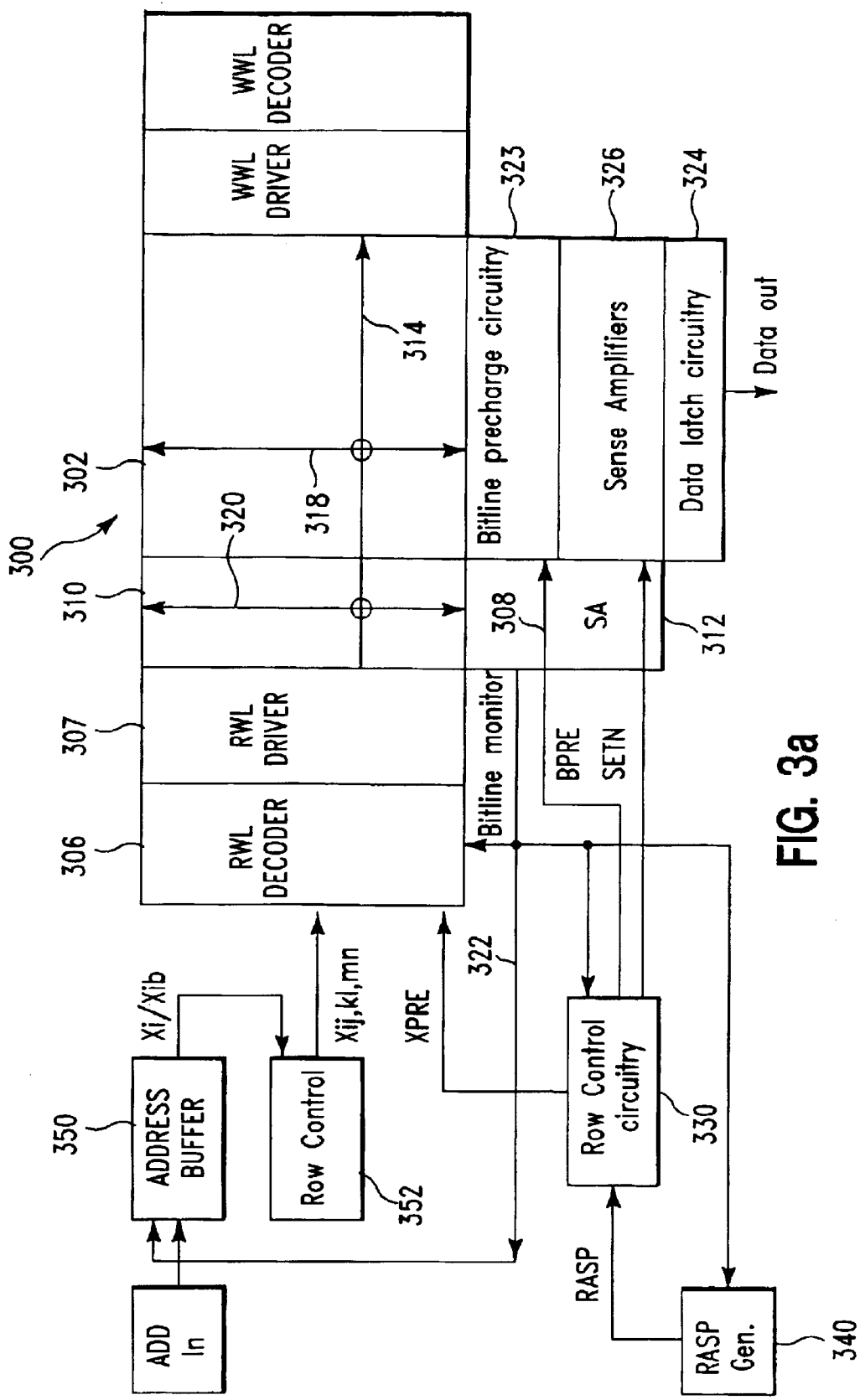
FIG. 3a is a block diagram illustrating a second embodiment of the invention having a bitline monitor interlock signal for controlling read cycle operation of a gain cell DRAM.

FIG. 3a illustrates another embodiment of the invention. In this embodiment, bitline monitoring circuitry 310 is added to the gain cell DRAM 300, for the purpose of accurately timing the generation of the wordline interlock signal. Other than the bitline monitoring circuitry 310, other circuitry of the gain cell DRAM 300 is the same as that shown and described above relative to FIG. 2a. The bitline monitoring circuitry 310 includes an unused (sample) read bitline 320 of the array 302, which is preferably coupled to operative but unused gain cells of the array and also coupled to actual read wordlines. This is in order to accurately represent the timing at which a signal from an accessed cell of the array 302 develops to a sufficient level at which it can then be sensed by a sense amplifier. The sample read bitline is coupled to an amplification device 312, preferably a dummy sense amplifier, for generating a bitline monitor output signal 322, which is then output to row control circuitry 330. The dummy sense amplifier 312 is designed to generate the bitline monitoring interlock signal with a consistent timing offset from the development of the signal of the sample bitline at the dummy sense amplifier 312. The timing offset is provided to help assure that actual sense amplifiers 326 are not triggered too early, which could lead to erroneous results.

The output 322 of the bitline monitor is used directly as the wordline interlock signal by the X-decoder (200; FIG. 2b) of the RWL decoder 306. In such way, the output 322 is a bitline monitor interlock signal. The X-decoder 200 promptly deactivates the active RWL in response to the bitline monitor interlock signal 322.

The bitline monitor interlock signal 322 is also used by row control circuitry 330 to generate a SETN signal to time the activation of sense amplifiers 326, after which the data is latched by data latch circuitry 324. The row control circuitry 330 also uses the bitline monitor interlock signal 322 to generate a bitline precharge signal (BPRE 308) at a short time thereafter, this signal being input to bitline precharge circuitry 323. As also shown in FIG. 3a, the bitline monitor interlock signal 322 is also provided to a circuit 340 which generates the row address strobe signal (RASP) as a way of providing overriding control over the cycle time of the gain cell DRAM 300. By monitoring the timing of the bitline monitor interlock signal 322 over time, the RASP generator 340 can determine if the read cycle time of the DRAM can be decreased, as by shortening the intervals between RASP signals.

In response to the bitline monitor interlock signal 322 the address buffer 350 is also disabled, causing address inputs Xi and Xib to predecoder 352 to be returned to the precharge state. This is performed in order to prevent oscillation through the closed loop then existing through the X-decoder inside the RWL decoder 306, RWL driver 307 and bitline monitoring circuitry 310 and 312.

Figure 3B:
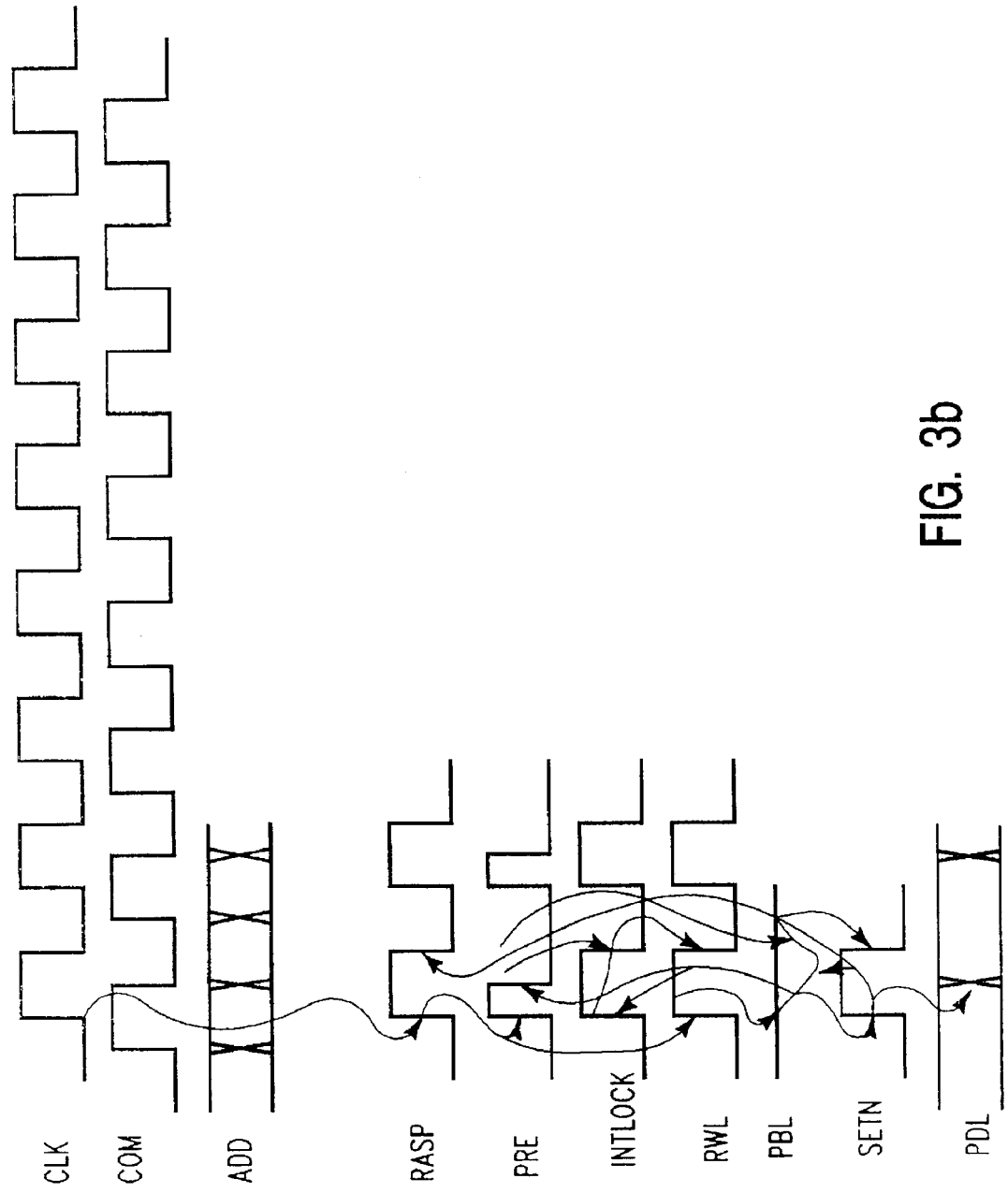

FIG. 3b is a timing diagram illustrating operation of the embodiment shown in FIG. 3a. At the top of FIG. 3b are shown a system clock CLK, commands COM, and address input ADD which provide an environment in which the embodiment of the invention operates. As shown in FIG. 3b, the overriding timing signal, row address strobe RASP, is triggered in response to CLK. In response to RASP, the precharging of the X-decoder is ended (signal PRE falls low) and the read wordline RWL is activated. Thereafter, a signal develops on the sample read bitline RBL. When the RBL signal is sufficiently strong, the bitline monitoring circuitry 310 generates the bitline monitor interlock signal (INTLOCK), which is then used by the row control circuitry 330 to generate the SETN signal, causing sense amplifiers of the DRAM 300 to amplify the data on the read bitlines coupled thereto, and then output the data onto primary data lines PDL.

Thereafter, the bitline monitor interlock signal causes the X-decoder to disable the active RWL and precharge the X-decoder for the next read cycle. Based on the bitline monitor interlock signal, other events occur, including the deactivation of the RASP strobe signal, disablement of the address buffer 350, and timing the precharging of the read bitlines of the gain cell array 302.

Figure 4:
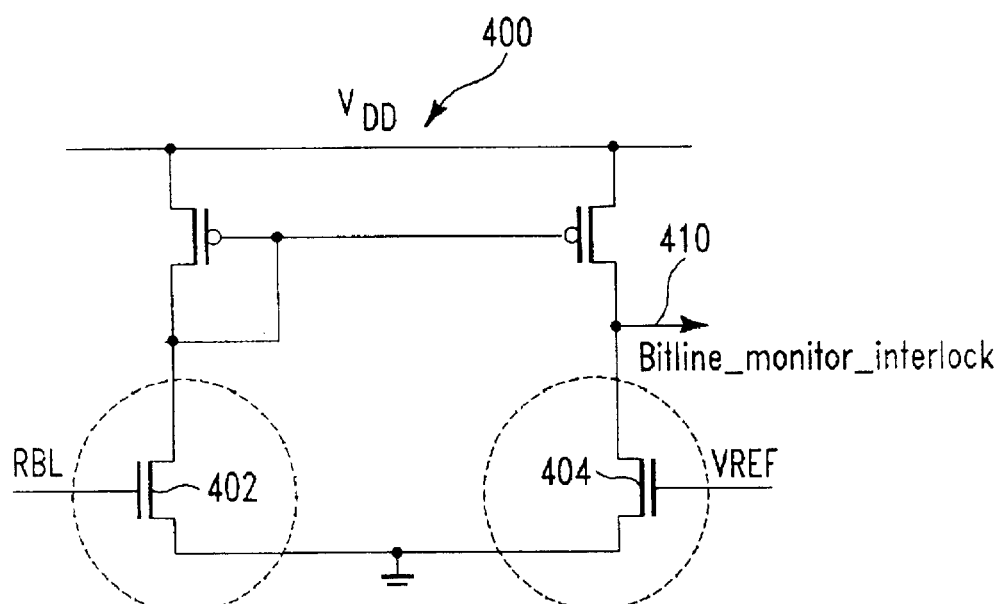
FIG. 4 illustrates the structure of a signal for generating a bitline monitor interlock signal from a sample read bitline.

FIG. 4 illustrates an exemplary embodiment of a bitline monitor circuit 400 for outputting a bitline monitor interlock signal 410 at a consistent timing offset in relation to a the arrival of a small amplitude signal on a sample read bitline RBL input thereto. The timing offset is generated by virtue of a permanent offset voltage that must be overcome by the RBL input to the circuit 400, before the bitline monitor interlock signal 410 transitions to high. The offset voltage arises because of a difference in the sizes of the gates of transistors 402 and 404. The asymmetric gate sizes of transistors 402, 404 cause transistor 404 to turn on later than it would be otherwise, so as to assure that sense amplifiers of the DRAM attached to the array do not begin sense amplification until all RBL signals from the array have arrived.

The trigger condition of the monitor circuit 400 can be adjusted by appropriately adjusting the reference voltage input thereto. For example, a programmable reference voltage can be input thereto, adjusted in response to operating conditions of the DRAM, such as temperature and supply voltage, and/or adjusted in response to a retention time of the DRAM.

Figure 5A:
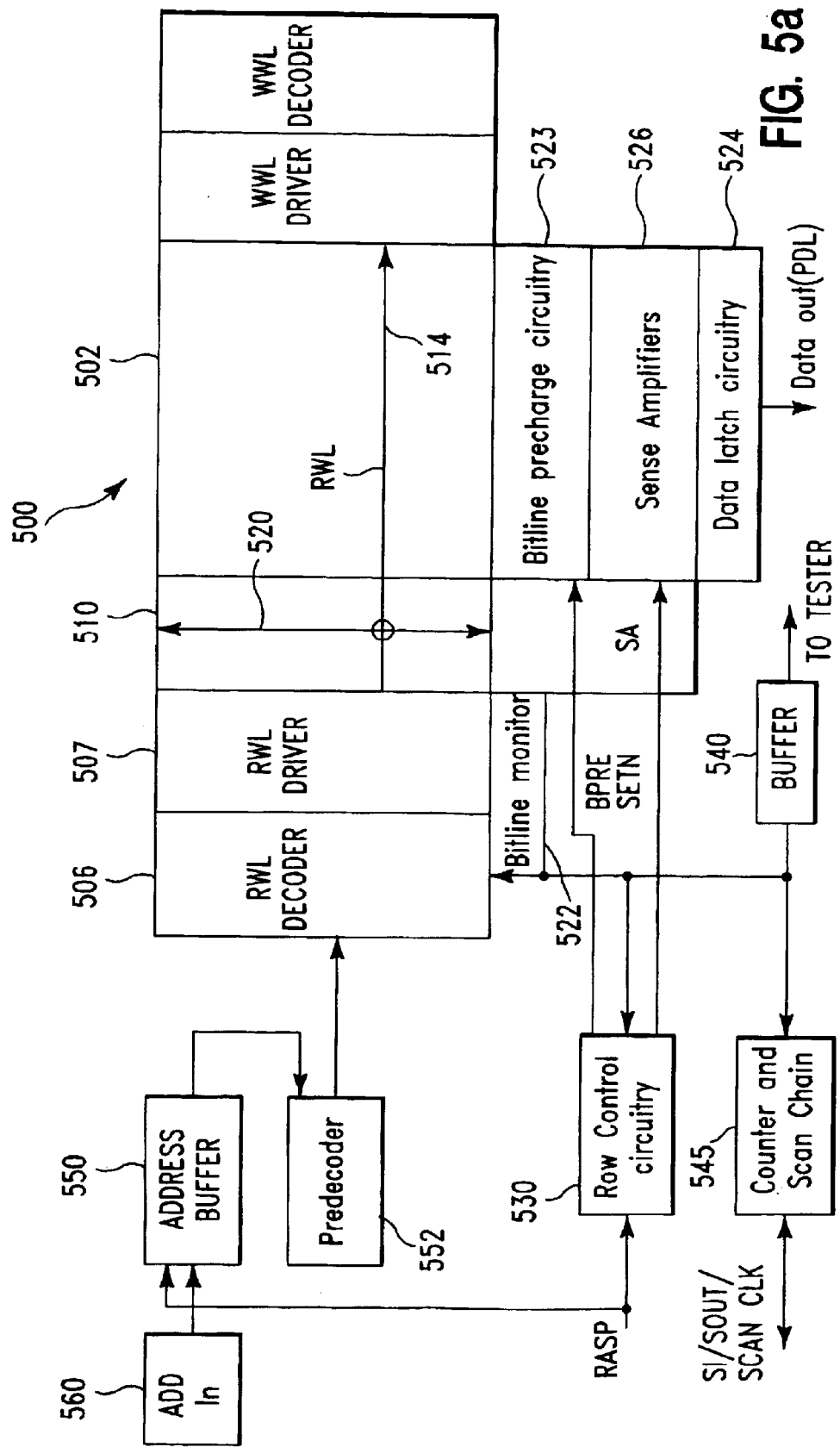
FIG. 5a illustrates a third embodiment of the invention suited for measuring a read cycle time of the gain cell DRAM.

FIG. 5a illustrates an arrangement of the gain cell DRAM 500 suitable for measuring the read cycle time for performing a read operation in the DRAM. As indicated in the foregoing, the read cycle time is the sum of the "ON" time for activating a read wordline of the DRAM 500 and the precharge time required before activating the next read wordline. The arrangement shown in FIG. 5a is similar to that shown in the gain cell DRAM 300 of FIG. 3a, except that the same address input 560 is maintained to the address buffer 550, and the bitline monitor interlock signal 522 is not used for disabling the address buffer 550. The bitline monitor interlock signal 522 is coupled to a buffer 540 for outputting the signal to external equipment such as a tester.

Figure 5B:
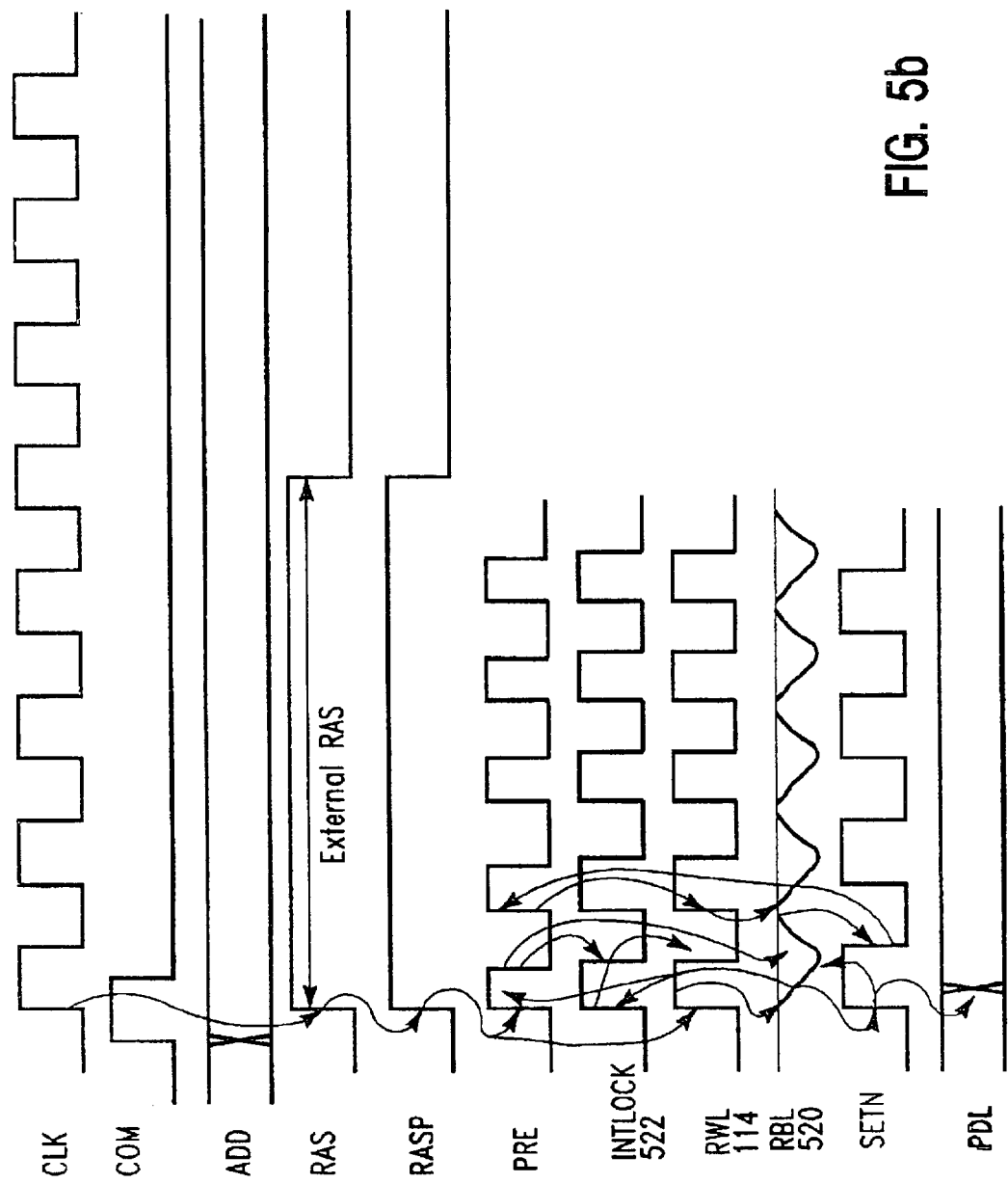

As further illustrated in FIG. 5b, while holding the RASP signal and an external row address strobe (RAS) signal active at the input to row control circuitry 530, a read command to a single read address is issued to initiate read cycle operation. As in the example shown in FIG. 3a, the read row address (ADD) is decoded by predecoder 552 and RWL decoder 506 to activate a RWL 502 of the array 500 by RWL driver 507, in turn. The signal on the sample read bitline (RBL) 520 is then monitored by the bitline monitoring circuitry 510 and when it reaches a sufficient magnitude, the bitline monitor interlock signal (INTLOCK) 522 is generated. The bitline monitor interlock signal (INTLOCK) 522, as provided to RWL decoder 506, then disables the X-decoder therein, such that the RWL 514 is deactivated. Bitline precharge (BPRE) and sense amplifier set signals (SETN) are triggered in response to the bitline monitor interlock 522. The BPRE signal is input to the bitline precharge circuitry 523, and the SETN is input to the sense amplifiers 526. The output of the sense amplifiers is latched by data latch circuitry 524.

While the RASP and RAS signals remain enabled, the bitline monitor interlock signal (INTLOCK) 522 falls thereafter, as a result of the RWL 114 being deactivated. However, as the inactive bitline monitor interlock signal 522 is provided to the X-decoder (200; FIG. 2) as the wordline interlock signal 132, the RWL 114 is activated again upon receipt of the inactive bitline monitor interlock signal 522 by the X-decoder. Thus, a closed loop cycle results in which RWL 114 is toggled between active and inactive states and the bitline monitor interlock 522 is toggled in response thereto between active and inactive states, respectively. By appropriately buffering and externally outputting the bitline monitor interlock signal 522 through buffer 540, the oscillations of that signal can be measured externally by an off-chip tester. In such a manner, the read cycle time of the gain cell DRAM 500 can be precisely measured by measuring the period of oscillation of the bitline monitor interlock signal 522.

In a preferred embodiment, a counter and scan chain 545 are provided for counting pulses of the bitline monitor interlock signal 522. In such way, the number of times can be counted in which the bitline monitor interlock 522 is active during a clocked RAS/RASP active period. Then, the read cycle time can be determined by dividing the RAS active period by the count maintained by the counter 545. Control, resetting, and read out of the counter is provided through a scan interface providing scan-in (SI), scan-out (SOUT) and scan clock (CLK). After obtaining a count, the counter 545 scans the data out of the scan interface to external equipment where it can then be analyzed.

While the invention has been described with reference to certain preferred embodiments thereof, those skilled in the art will understand the many modifications and enhancements which can be made thereto without departing from the true scope and spirit of the invention, which is limited only by the claims appended below.

What is claimed is:

1. A method of accessing a storage cell of a dynamic random access memory (DRAM) having an array of gain cells being read accessible by a read wordline and a read bitline, and being write accessible by a write wordline and write bitline separate from said read wordline and read bitline, comprising:

activating a read wordline of said array of gain cells to permit signals from a plurality of gain cells coupled to said read wordline to develop on a plurality of corresponding read bitlines coupled to said plurality of gain cells;

generating an interlock signal in said DRAM after activating said read wordline; and deactivating said read wordline in response to said interlock signal.

2. The method of claim 1 further comprising timing the precharging of read bitlines of said array of gain cells in relation to said interlock signal.

3. The method of claim 1 further comprising timing the setting of sense amplifiers coupled to read bitlines of said array of gain cells in relation to said interlock signal.

4. The method of claim 1 further comprising setting sense amplifiers to amplify signals on said read bitlines in response to said interlock signal.

5. The method of claim 1 wherein said interlock signal is generated in response to a change in voltage of a sample bitline of said DRAM, said sample bitline being coupled to a plurality of gain cells and a sample sense amplifier.

6. The method of claim 5 wherein said interlock signal is generated by differentially amplifying a difference in the voltage of said sample bitline relative to a reference voltage.

7. The method of claim 6 further comprising programmably adjusting a level of said reference voltage to adjust triggering of said interlock signal.

8. The method of claim 7 wherein said reference voltage level is adjusted relative to an operating condition of said DRAM including at least one selected from the group consisting of temperature and supply voltage.

9. The method of claim 7 wherein said reference voltage level is adjusted relative to a retention time of said DRAM.

10. The method of claim 5 wherein said voltage of said sample bitline changes in response to accessing a gain cell of said plurality of gain cells coupled thereto, said gain cell having a three transistor, one capacitor structure.

11. A dynamic random access memory (DRAM), comprising:

an array of gain cells being read accessible by a read wordline and a read bitline, and being write accessible by a write wordline and write bitline separate from said read wordline and said read bitline;

a row decoder operable in response to a row address strobe signal to activate a read wordline of said array of gain cells to permit signals from a plurality of gain cells coupled to said read wordline to develop on a plurality of corresponding read bitlines coupled to said plurality of gain cells; and a circuit operable to generate an interlock signal at a time after said row address strobe signal, wherein said row decoder is further operable to deactivate said read wordline in response to said interlock signal.

12. The DRAM of claim 11 further including sense amplifiers, operable to amplify signals on bitlines connected thereto in response to said interlock signal.

13. The DRAM of claim 11 wherein said circuit operable to generate said interlock signal includes a sample bitline and is operable to generate said interlock signal in response to a change in a voltage of said sample bitline.

14. The DRAM of claim 12 wherein said sample bitline is a sample read bitline coupled to a plurality of gain cells of said array of gain cells and coupled to a sample sense amplifier.

15. The DRAM of claim 14 wherein said circuit operable to generate said interlock signal includes a differential amplifier coupled to said sample bitline to receive a first input voltage and coupled to receive a reference voltage as a second input voltage, said differential amplifier being operable to generate said interlock signal when said first input voltage crosses a level of said reference voltage.

16. The DRAM of claim 15 wherein said reference voltage has a programmably adjustable value.

17. The DRAM of claim 15 wherein said differential amplifier includes a first transistor having a gate coupled to said sample bitline to receive said first input voltage and a second transistor having a gate coupled to said reference voltage as said second input voltage, wherein said circuit is operable to generate said interlock signal as a voltage on at least one of a source and a drain of said second transistor, wherein a size of said gate of said first transistor is larger than a size of said gate of said second transistor such that a voltage gain of said second transistor is larger than a voltage gain of said first transistor.

18. The DRAM of claim 17 wherein said differential amplifier further includes a pair of transistors each having gates coupled to a common input potential and at least one of a source and a drain coupled to a common supply potential.

19. The DRAM of claim 13 wherein said DRAM further comprises means for timing the setting of a sense amplifier in relation to said interlock signal.

20. The DRAM of claim 13 wherein said DRAM further comprises means for timing the precharging of read bitlines of said array of gain cells in relation to said interlock signal.

* * * * *